US007567016B2

(12) United States Patent
Lu et al.

(10) Patent No.: US 7,567,016 B2
(45) Date of Patent: Jul. 28, 2009

(54) MULTI-DIMENSIONAL ULTRASOUND TRANSDUCER ARRAY

(75) Inventors: Xuan-Ming Lu, San Jose, CA (US); Timothy L. Proulx, Santa Cruz, CA (US); Lewis J. Thomas, III, Palo Alto, CA (US); Worth B. Walters, Cupertino, CA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 289 days.

(21) Appl. No.: 11/051,349

(22) Filed: Feb. 4, 2005

(65) Prior Publication Data

US 2006/0241468 A1 Oct. 26, 2006

(51) Int. Cl.
*H01L 41/047* (2006.01)
*H01L 41/083* (2006.01)

(52) U.S. Cl. ........................ 310/322; 310/334; 310/366

(58) Field of Classification Search ................. 310/334, 310/335, 365–366, 359, 322
See application file for complete search history.

(56) References Cited

U.S. PATENT DOCUMENTS 4,371,805 A * 2/1983 Diepers et al. .............. 310/334
5,381,385 A 1/1995 Greenstein
5,548,564 A 8/1996 Smith
5,573,001 A 11/1996 Petrofsky et al.
5,704,105 A 1/1998 Venkataramani et al.
5,834,880 A 11/1998 Venkataramani et al.
6,065,196 A * 5/2000 Inoi et al. .................. 29/25.35
6,288,477 B1 9/2001 Gilmore et al.
6,359,367 B1 3/2002 Sumanaweera et al.
6,503,204 B1 1/2003 Sumanaweera et al.
6,532,819 B1 3/2003 Chen et al.
6,537,220 B1 * 3/2003 Friemel et al. .............. 600/447
6,572,547 B2 6/2003 Miller et al.
6,582,367 B1 6/2003 Robinson et al.
6,603,240 B1 * 8/2003 Kohno et al. ................ 310/334
6,656,124 B2 12/2003 Flesch et al.
6,679,849 B2 1/2004 Miller et al.
6,774,540 B2 * 8/2004 Fukukita ..................... 310/334
6,780,157 B2 8/2004 Stephens et al.
6,798,717 B2 9/2004 Wiener-Avnear et al.
2001/0050514 A1 12/2001 Gururaja
2002/0043896 A1 4/2002 Hashimoto
2002/0130591 A1 9/2002 Fraser
2003/0107303 A1 6/2003 Mohr, III et al.

FOREIGN PATENT DOCUMENTS

EP 0 697 257 A2 2/1996

* cited by examiner

*Primary Examiner*—Quyen Leung
*Assistant Examiner*—Derek J Rosenau

(57) ABSTRACT

In $k_{31}$ mode, a vibration is along an axis or orthogonal to the poling or electric field orientation. The direction of vibration is toward a face of an ultrasound transducer array. For each element of the array, electrodes are formed perpendicular to the face of the array, such as along the sides of the elements. Piezoelectric material is poled along a dimension parallel with the face of the transducer and perpendicular to the direction of acoustic energy propagation. Using elements designed for $k_{31}$ resonant mode operation may provide for a better electrical impedance match, such as where small elements sizes are provided for a multi-dimensional transducer arrays. For additional impedance matching, the elements may be made from multiple layers of piezoelectric ceramic. Since the elements operate from a $k_{31}$ mode, the layers are stacked along the poling direction or perpendicular to a face of the transducer array for transmitting or receiving acoustical energy.

12 Claims, 2 Drawing Sheets

MULTI-DIMENSIONAL ULTRASOUND TRANSDUCER ARRAY

BACKGROUND

The present invention relates to ultrasound transducers. In particular, ultrasound transducers for electrical communication with an imaging system are provided.

Conventional ultrasound transducer arrays operate in a longitudinal extensional or $k_{33}$ resonant mode. Each element of the array has an electrode on the top surface of the element and another on the bottom surface of the element. The element is poled orthogonal to the electrodes or in a direction extending between the electrodes. In response to a potential difference applied across the electrodes, vibration is generated on the same orientation as the poling. Acoustic energy propagates along a direction extending from the face of the element covered by one of the electrodes.

Due to the size constraints of elements within a multi-dimensional transducer array, multi-layered piezoelectric ceramics have been suggested to provide a better impedance match with a cable and/or the imaging system electronics. Layers of piezoelectric ceramics are stacked along the same dimension as the poling, along the vibration or thickness dimension. Alternating layers of electrodes are electrically connected in parallel, providing a capacitance proportional to the square of the number of layers. However, making multiple connections on these elements is difficult. Vias for forming the connections have been proposed, but this method is difficult and costly. Vias also reduce the active area for transduction. Where patterning and partial dicing are used, undiced ceramics may result in generation of undesirable acoustic modes. Using electrodes on the sides of the small multi-dimensional elements for $k_{33}$ mode operation may result in poor performance due to undesired contributions of the electric field transverse to the displacement direction. Methods where hundreds or thousands of individual multi-layer piezoelectric actuator posts are created, wire bonded and re-assembled into an array can be difficult and costly.

Small single layer elements of a multi-dimensional ultrasonic array may have a very low capacitance when electrically connected. For example, a 250×250×300 micrometer single layer piezoelectric element for operation at 5 megahertz has a capacitance of about 2 picoFarads (pF) in a $k_{33}$ resonant mode. Such capacitance may not effectively drive a cable electrical load of 50 to 100 pF without impedance matching. Impedance matching at the element adds undesired size to arrays, such as arrays meant for use within a patient, and may degrade the signal to noise ratio.

A composite PZT operating in $k_{31}$ mode has been proposed for matching electrical impedance. A dicing kerf and conductive filler, such as silver epoxy, are used as electrodes. However, conductive epoxy may result in strong acoustical cross coupling between elements. Additionally, using a kerf as an electrode substantially reduces the active piezoelectric material, reducing efficiency of the device.

BRIEF SUMMARY

By way of introduction, the preferred embodiments described below include ultrasound transducer arrays, methods for forming arrays and methods for transducing using transverse extensional mode or $k_{31}$ resonance. In $k_{31}$ mode, vibration is along an axis orthogonal to the poling and electric field orientation. The direction of vibration is toward a face of the transducer array. For each element, electrodes are formed perpendicular to the face of the array, such as along the sides of the elements. Piezoelectric material is poled along a dimension parallel with the face of the transducer and perpendicular to the direction of acoustic energy propagation. Using elements designed for $k_{31}$ resonant mode operation may provide for a better electrical impedance match, such as where small elements sizes are provided for a multi-dimensional transducer arrays. For additional impedance matching, the elements may have multiple layers of piezoelectric material. Since the elements operate from a $k_{31}$ mode, the layers are stacked along the poling direction or perpendicular to a face of the transducer array for transmitting or receiving acoustical energy. The features discussed above may be used alone or in combination.

In a first aspect, an ultrasound transducer array is provided for converting between acoustic and electrical energies. At least two elements are provided. Both the elements have an acoustic surface for transmitting or receiving acoustic energies. One of the elements has at least first and second layers of transducer material. The layers are more perpendicular than parallel to the acoustic surface.

In a second aspect, an ultrasound transducer array is provided for converting between acoustic and electrical energies. At least one element is operable in a $k_{31}$ resonant mode. The element is poled in a direction more perpendicular than parallel to a longitudinal displacement direction. Electrodes are positioned substantially orthogonal to the poling direction.

In a third aspect, an improvement in a multi-dimensional ultrasound transducer array is provided for converting between acoustic and electrical energies. A multi-dimensional ultrasound transducer array has an N by M arrangement of a plurality of elements where both N and M are greater than one. Each of the plurality of elements is oriented to transmit or receive in a $k_{31}$ resonance mode.

In a fourth aspect, a method is provided for transducing between ultrasound and electrical energies. A plurality of ultrasound transducer elements are oriented in a multi-dimensional array to transmit and receive along a first direction. The plurality of ultrasound transducer elements operate in a $k_{31}$ resonant mode. The $k_{31}$ resonant mode dominates other modes during operation.

In a fifth aspect, a method is provided for forming an ultrasound transducer element. A plurality of layers of transducer material is stacked along a first dimension. Electrodes are positioned on the stacked layers. The electrodes are more orthogonal than parallel to the first dimension. A matching layer is positioned substantially parallel to the first dimension.

The present invention is defined by the following claims, and nothing in this section should be taken as a limitation on those claims. Further aspects, features and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

Elements operable in a $k_{31}$ resonant mode are in an ultrasound transducer array, such as a multi-dimensional array. In a $k_{31}$ resonant mode, the electric field and poling direction are perpendicular to the longitudinal displacement direction. One or more layers of piezoelectric material and associated electrodes are oriented or stacked along a direction perpendicular to the longitudinal displacement direction. Alternatively, a conductive via is formed within each element along a direction perpendicular to an acoustic face and parallel to the longitudinal displacement direction. Operating in $k_{31}$ mode and positioning electrodes along the sides of the elements provide increased capacitance compared to conventional $k_{33}$ operation due to the increased electrode surface area. Also, multiple layers of piezoelectric material connected in parallel cause an increase in capacitance by a factor of the number of layers squared, thus providing the capability of efficiently driving a cable load without impedance matching electronics at the element. A fewer number of layers may be provided for the same capacitance as compared with a conventional $k_{33}$ resonant mode. Any one or more features discussed above may be used in a given transducer array.

Figure 1:
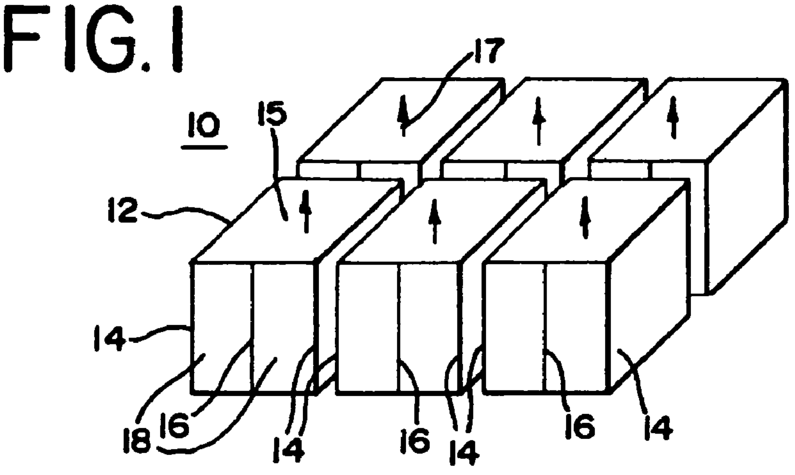
FIG. 1 is a partial view of one embodiment of a multiple element, multi-dimensional transducer array.

FIG. 1 shows one embodiment of an ultrasound transducer array 10 for converting between acoustic and electrical energies. The array 10 includes a plurality of elements 12. Each element 12 includes piezoelectric transducer material, such as PZT-5H, HD3203, an electrostrictive, or piezoelectric single crystal (e.g., PMN-PT and PZN-PT [110] cut). Other now known or later developed transducer materials may be used. In response to electric potential applied across the transducer material, each element 12 transmits or generates acoustic energy at the acoustic surface 15 along a longitudinal displacement direction 17. The longitudinal displacement direction 17 is orthogonal to the acoustic surface 15. The direction is a simplification as acoustic energy tends to radiate away from the acoustic surface along a number of directions, but has a greater extent of energy or is generally along the longitudinal displacement direction 17. For reception, acoustic energy received at the acoustic surface 15 is converted to electrical potential by each element 12.

One or more of the elements 12 of the array 10 are operable in a $k_{31}$ resonant mode during either transmit or receive processes. Other modes of operation may result, but they are designed to be outside the desired frequency band so that the $k_{31}$ mode is dominant. For operations in the $k_{31}$ resonant mode, a height of the element 12 along the longitudinal displacement direction 17 is at least twice a width in an orthogonal plane, such as along a poling direction. In one embodiment, the height is approximately 3 times the width, such as for providing a 250 micrometer pitch for a multi-dimensional transducer array 10 for operation at 5 MHz. The depth dimension is the same, similar or different than the width dimension, such as being approximately one-third of the height dimension. Other height, width and depth relationships may be provided.

The piezoelectric material is poled in a direction more perpendicular than parallel with the longitudinal displacement direction 17. As shown in FIG. 1, the poling direction is horizontal. The poling is in different directions along the same axis for different layers in a same element, but may be in a same direction or on a different axis, but still orthogonal to the longitudinal displacement direction.

The acoustic surface 15 is shown as a top surface of each element 12. The poling is substantially in parallel with the top surface 15. The poling direction is typically formed by an initial large potential being formed across the element 12 or across the transducer materials used to form the element 12. The poling direction is then permanently or semi-permanently set.

In one embodiment, each element 12 is formed from a single layer 18 of transducer material. For example, a single slab of piezoelectric ceramic is used to form each of the elements 12. The element 12 may include a conductive via 16 along a direction parallel to the longitudinal displacement direction. In alternative embodiments, the capacitance is altered in each of the elements 12 by providing multiple layers 18, such as 2, 3 or more layers 18. In one embodiment, each element 12 in a finished or operable configuration has four layers 18 of transducer material, but a greater or less number of layers 18 may be provided.

The layers 18 each comprise slab, plate, or other structures stacked along the poling direction or stacked horizontally as shown in FIG. 1. Each slab of the layers 18 is along the longitudinal displacement direction 17, resulting in a stack or layered structure extending perpendicular to the longitudinal displacement direction 17. Each element 12 shown in FIG. 1 is stacked along a same dimension, but some of the elements 12 may be stacked along a perpendicular dimension, such as the depth dimension also perpendicular to the longitudinal displacement direction 17. The thickness and number of layers 18 is used to provide a height perpendicular to the acoustic surface 15 (i.e., height in the longitudinal displacement direction) that is at least twice the width of the stacked layers 18 of transducer material.

As shown in FIG. 1, each element 12 is formed by a single structure of stacked layers 18. In an alternative embodiment shown in FIG. 4, each element 12 is formed from two or more sub-elements 21, such as four sub-elements 21 formed in a square pattern for the element 12. Each of the sub-elements 21 has multiple layers 18 of transducer material, but a single layer 18 may be provided for one or more of the sub-elements 21. Each of the sub-elements 21 has the layers 18 stacked perpendicular to the longitudinal displacement direction 17. Similarly, each of the sub-elements 21 satisfies the height and width criteria for efficient $k_{31}$ mode of operation independent of the other sub-elements 21, such as 300 microns in height and 80 microns in depth and width. For acoustic separation, materials such as an air, silicon RTV or other low modulus kerf fillers separate each of the sub-elements 21 from other sub-elements 21 within the same element 12. A bridge 28 of transducer material may connect the sub-elements 21. Alternatively, bridges 28 in other locations or no bridge 28 is provided between the sub-elements 21. The bridge 28 is as thin as possible within manufacturing tolerances without risking exposure of a signal electrode to a ground electrode.

Figure 4:
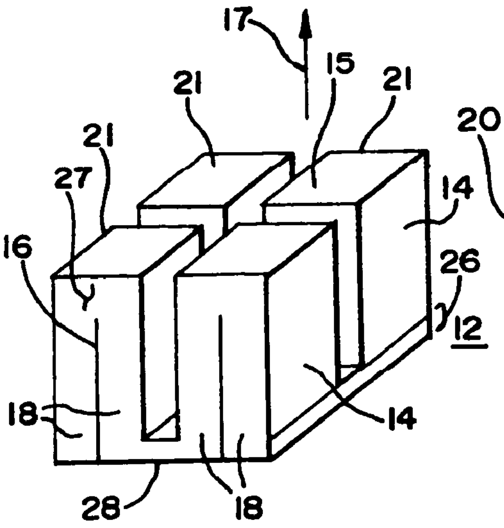
FIG. 4 is a perspective view of one embodiment of one or more multi-layer $k_{31}$ mode transducer elements.

As shown in FIGS. 1 and 4, electrodes 14, 16 are formed on or within each element 12. Each electrode 14, 16 is a metal conductor, such as a thin plated electrode. Deposition or other techniques may be used to plate the electrode for tape casting or stacking layers of the piezoelectric material. One electrode 14 is a ground electrode, such as shown on an outer surface of each element 12 or sub-element 21. Another electrode 14 is on another outer surface, such as sandwiching the sub-element 21 or element 12 between the two electrodes 14 on the outer surfaces. Each kerf separating the elements 12 or sub-elements 21 is at a same ground potential. Where the sub-element 21 or element 12 is formed from a single or odd number of layers 18, the signal electrode 16 and the ground electrode 14 on the two outer surfaces are electrically isolated from each other. Where multiple layers 18 are provided, one or more signal electrodes 16 are formed within the sub-element 21 or element 12, such as being sandwiched between two layers 18 of transducer material. In a multiple layer 18 embodiment, every other electrode 14, 16 is electrically connected together within the same element 12, such as by wire bonds, electrodes on the top or bottom surfaces of the sub-elements 21 or element 12, vias or other electrical connectors. The electrodes 14, 16 form two different electrodes for applying a potential difference for the element 12 or sub-element 21. The two electrodes 14, 16 are electrically isolated from each other. For example, the gap 26 of the electrodes 14 on an outer surface avoids connection of the ground electrodes 14 to a signal electrode formed along a bottom surface of each of the sub-elements 21 or the element 12.

For the $k_{31}$ mode of operation, the electrodes 14, 16 are substantially orthogonal to the poling direction, such as being linear, flat, irregular or other shapes and size of electrically conductive materials running parallel with the longitudinal displacement direction 17.

The elements 12 are arranged as a multi-dimensional transducer array. For example, a multi-dimension array 10 of 32×32 elements 12 is provided. The multi-dimensional array 10 operates as a two dimensional array for independent electronic steering along the azimuth and elevation directions. In yet another embodiment, the elements 10 are distributed for an operation as a 1.25, 1.5 or 1.75 dimensional array 10. For a multi-dimensional array, the plurality of elements is distributed in an N×M arrangement where both N and M are greater than 1. Some or all of the elements 12 are operable in a $k_{31}$ mode of operation to transmit or receive acoustic energies at the acoustic surface 15. Each of the elements 12 has a same or different structure, such as number of layers 18, number of sub-elements 21, height relative to width and depth dimensions, placement of electrodes 14, 16, bridges 28 or other structures. Each element 12 has one or more independent ground electrodes 14. Different elements 12 do not share a same entire ground electrode 14 for the $k_{31}$ mode of operation. The ground electrodes 14 may have a common electrical connection with other elements 12, but are physically separate or independent for use in the $k_{31}$ mode. The kerf separates the portions of the ground electrodes 14 used to generate the transverse electric field in each separate element. The elements are separated by a non-conductive kerf.

The multi-dimensional transducer array 10 is sized for the desired use, such as providing relatively larger arrays for use in a hand held transducer array. In other embodiments, the array 10 has a pitch of 500 micrometers or less, such as a 250 micrometer pitch for a 32×32 element array of 8 millimeters×8 millimeters. Such small arrays may be used in transesophageal, pediatric cardiology, endoscope, laposcope, cardiac catheter or other endocavity probes.

Figure 3:
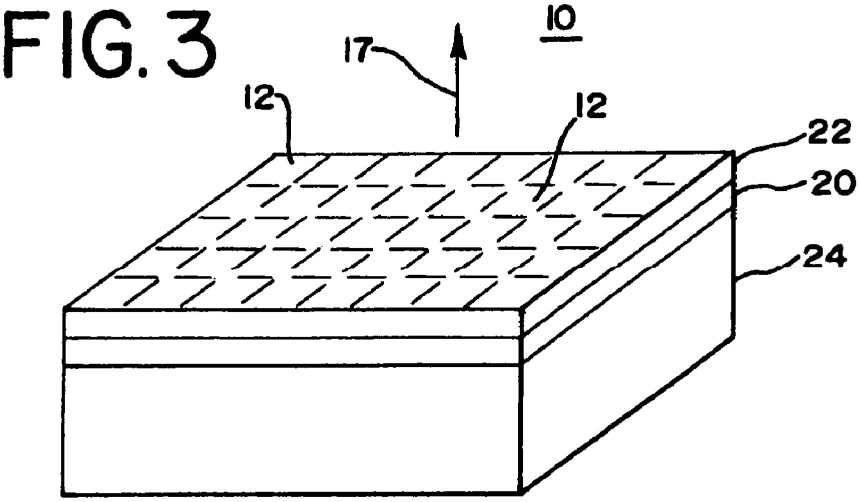
FIG. 3 is a perspective view showing a multi-dimensional transducer stack in one embodiment.

As shown in FIG. 3, the array 10 is a stack of the transducer layer 20 between a backing block 24 and a matching layer 22. The backing block 24 and matching layer 22 are generally parallel with the acoustic surface 15 of the elements 12. The matching layer 22 is adjacent to the top surface or acoustic surface 15 for acoustic impedance matching between the transducer layers 20 and the structure or tissue for intended use, such as the skin of a patient. One or more matching layers 22 are provided and either may be non-conductive or conductive.

Conductors for transmitting electrical signals to and from the electrodes 14, 16 are also provided within the stack. For example, Z-axis backing is provided within the backing block 24 for connection with a flexible circuit below the backing block 24. Alternatively, a single or two sided flexible circuit material connects between the backing block 20 and a transducer layer 20 for separate electrical connection with each of the elements 12. In another embodiment, a plurality of single or multi-dimensional modules of elements and associated flexible circuits are mounted adjacent to each other. A separate flexible circuit or conductive matching layer is used for connecting a grounding plane or other conductors to the second electrode 14. For example, a separate flexible circuit or conductive matching layer is connected on top of or below the matching layer 22 and above the transducer layer 20.

FIGS. 2-8 represent different embodiments of methods for forming an ultrasound transducer element 12. Other methods than described below or shown in FIGS. 2-8 may be used. For example, an array of elements for $k_{31}$ resonant mode operation using a single layer 18 of transducer material for each element 12 may be provided using dicing and plating.

Figure 2:
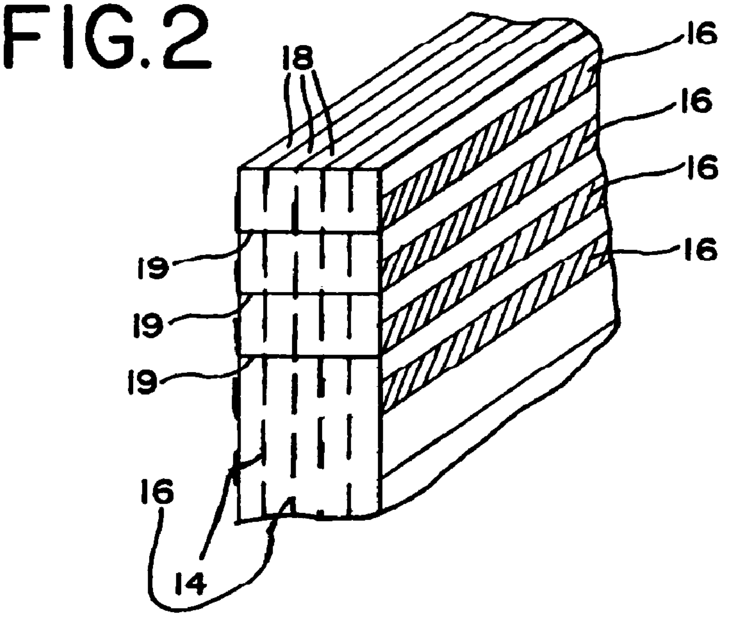
FIG. 2 is a perspective view of a stack of transducer material layers during manufacturing in one embodiment.
Figure 6:
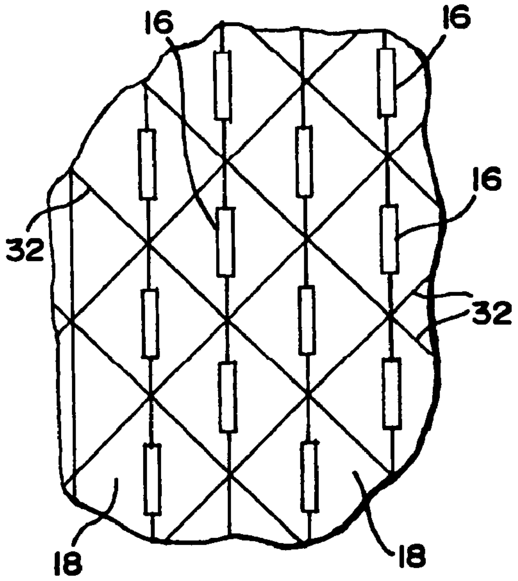
FIG. 6 is a top view of one embodiment of a multi-dimensional transducer array in another embodiment.
Figure 8:
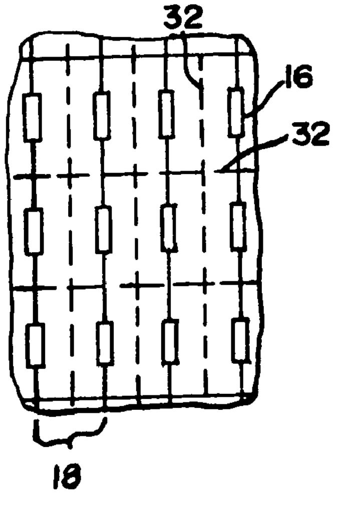
FIG. 8 is a top view of one embodiment of a multi-dimensional transducer array in an alternative embodiment.

For elements 12 formed from multiple layers 18 of transducer material, the multiple layers 18 are stacked along a first dimension. For example, FIG. 2 shows a plurality of layers 18 stacked along a horizontal dimension. As another example, FIGS. 6 and 8 show a plurality of layers 18 stacked along a horizontal dimension from a top view.

Electrodes 14, 16 are positioned on the stacked layers 18. Different embodiments are provided for forming the electrodes 14, 16 as parallel to the stacking dimension. The electrode alignment allows for a substantially transverse electric field for operation in the $k_{31}$ mode. Other portions of the electrodes 14, 16 may be formed on a top or bottom for interconnecting the electrodes 14, 16 associated with different layers 18 or for connection to a ground plane or signal path.

Figure 5:
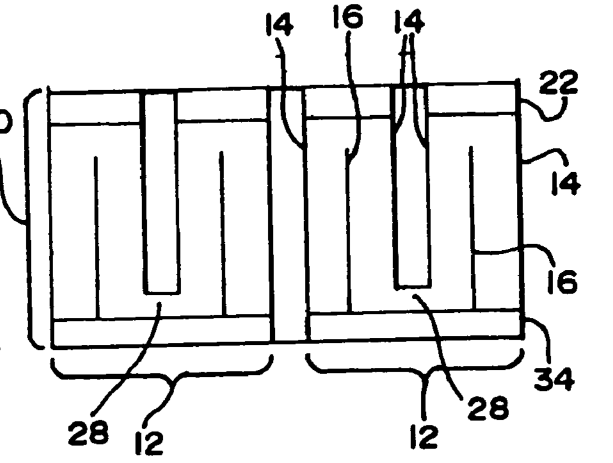
FIG. 5 is a side view of one or more elements operable in a $k_{31}$ mode in other embodiments.
Figure 7:
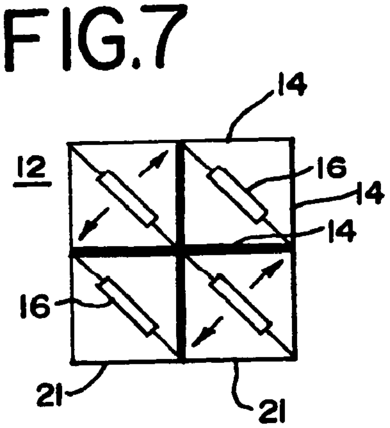
FIG. 7 is a top view of one or more elements from the array shown in FIG. 6.

FIGS. 2-4 represent one embodiment of a method for positioning the electrodes 14, 16. FIG. 5 represents another embodiment. FIGS. 6 and 7 represent yet another embodiment. FIG. 8 represents an additional embodiment.

Referring to FIG. 2, the electrodes 14, 16 are patterned onto the layers 18 of transducer material prior to stacking. For example, FIG. 2 shows a repeating pattern of the signal electrodes 16. The ground electrodes 14 have a similar repeating pattern, but in pairs. The patterns of the electrodes 14 and 16 alter by providing for the gap 26 or gaps 27. For example, the top surface of the stack of layers 18 shown in FIG. 2 and a cut along the line 19 are used to form the transducer elements. The signal electrodes 16 are patterned to connect or be exposed after cutting along the line 19, but to avoid exposure on a top surface. Similarly, the ground electrodes 14 are patterned to be exposed on a top surface but avoid exposure on the bottom surface along the cut line 19. Each layer 18 is formed by ceramic tape casting or by stacking and bonding. The electrodes 14, 16 are deposited or otherwise formed on each of the layers 18. In one embodiment, each layer has the same or different electrodes 14, 16 formed on opposite sides of the layer 18.

The layers 18 are stacked. For example, 192 40 micron layers are stacked. Greater or lesser number of layers 18 and/or thickness of the layers 18 may be used. A plurality of arrays 10 may be formed out of the same stack, such as by dicing and lapping along the line 19 as well as other lines along the height of the stack. The dicing and lapping are performed orthogonal to the stacking dimension, such as along dicing line 19 in a plane parallel to the top surface of the eventual transducer.

The slab of transducer material 20 is lapped or ground to a desired thickness, such as 300 microns. Electrodes are then plated on the top and bottom surfaces of the slab of transducer material 20, such as depositing metallic conductors on the wafer. Where Z-axis connections are provided in the backing block 24, the slab of transducer material 20 is aligned with the Z-axis connectors. Where matching layer 22 is provided before dicing the elements 12, the matching layer 22 is a conductive matching layer, such as graphite.

As shown in FIG. 3, the lapped or ground multi-layer 18 structure forms the slab of transducer material 20 for positioning on a backing block 24 with or without the matching layer 22. In one embodiment, the slab of transducer material 20 is positioned on the backing block 24 prior to forming the elements 12. Alternatively, the elements 12 are formed in the transducer material 20 prior to bonding or stacking with the backing block 24.

The elements 12 are formed by dicing through the transducer material 20. For a rectangular grid of elements 12, kerfs are formed in a plane perpendicular to the longitudinal displacement direction 17. Triangular, hexagonal or other element distribution patterns may be provided. The dicing is aligned with the patterned electrodes 14, 16. For example, the dicing blade is sized to be about a same size or thickness as one of the layers 18. The dicing then removes the transducer material while leaving electrodes 14, 16. By dicing every third or other frequency of layers 18, the desired electrode structure remains. For example, each kerf is formed between the pairs of adjacent ground electrodes 14, leaving the ground electrodes on the outer surfaces of each element 12 or sub-element 21 and the signal electrode 16 embedded in the element 12 or sub-element 21. In yet other alternative embodiments, each kerf is greater or less than a thickness of one of the layers 18. Additional electrodes 14, 16 may be formed by depositing metal in the kerfs after the dicing.

FIG. 4 shows one embodiment for dicing with four layers 18 of transducer material in each element 12. Dicing cuts to form each of the elements 12 extend through any matching layers 22 and the transducer material 20 to the backing block 24. Additional kerfs are formed within each element 12 to form the sub-elements 21. The kerfs within each element extend into the transducer material 20 but not through the transducer material 20, leaving the bridge 28. Alternatively, the kerfs extend through the entirety of the transducer material 20. Each of the sub-elements 21 has a ground electrode 14 on two opposing outer surfaces, one exterior to the element 12 and the other interior to the element 12. The electrodes 14 are connected together by an electrode formed on the top surface 15 prior to the dicing. In alternative embodiments, the electrodes 14 are formed by depositing conductive material after dicing. An additional electrode 16 is positioned or embedded within each of the sub-elements 21. The additional electrode 16 connects to a signal path or other Z-axis connector. In one embodiment, a common signal path is provided for the entire element 12, and each of the electrodes 16 within each of the sub-elements 21 connects to the same signal path. Alternatively, separate signal paths are provided for each of the sub-elements 21.

A ground plane is then formed by bonding a thin foil, flex circuit or first or additional conductive and undiced matching layers 22 to the diced structure using a low modulus filler material, such as silicone RTV to acoustically isolate the elements. Alternatively, a thin layer of epoxy may be used to create air filled kerfs. Additional non-conductive matching layers 22 may be bonded to improve acoustic impedance matching.

FIG. 5 shows another embodiment for forming each of the elements 12. As an alternative to patterning the electrodes 14, 16 on one or more of the layers 18 of transducer material, each of the layers 18 has electrode material deposited on entire opposing surfaces or at least an entirety of one surface to form signal electrodes 16. The thickness of the layer 18 is equal to the element pitch for a two-layer structure, or half the pitch for a four-layer structure. As compared to the electrode layering of FIG. 2, the signal electrodes 16 are formed on the layers 18 prior to stacking and the ground electrodes 14 are not. After stacking the layers 18 together and lapping to a desired height, one or more matching layers 22 are then bonded on a top surface of the slab. The matching layer surface is perpendicular to electrodes 16. The elements and sub-elements are formed by dicing. The electrodes 14 are created by metallizing the kerfs. The kerfs can be further filled with RTV or other low modulus kerf fill materials or air to decouple acoustic energy between elements. Alternatively, the kerfs are filled with conductive RTV to form a ground connection and acoustic isolation at the same time. The ground connection can be achieved by attaching a thin metal layer on top of the matching layer 22 or simply connecting to the edge of the transducer. The electrodes in the kerfs separating the elements 12 or sub-elements 21 may be at a same ground potential. FIG. 5 shows the electrodes 34 are patterned on the bottom surface such that electrodes 14 are not contacted by the electrode 34. The electrode 34 is deposited over or on the exposed electrode 16. The patterned electrodes 34 form signal paths substantially perpendicular to the electrodes 14, 16. The dicing cuts to form each of the elements 12 extend through transducer material and into the backing block 24. Dicing to form sub-elements 21 leaves a bridge 28 to avoid the electrical connection of the signal path 34 to the electrodes 14. An alternate way of making the top of the transducer material layer 20 for connection with the matching layer 22 may be depositing with or without patterning of the electrodes. A ground plane or flex circuit connects between the two matching layers 22. Alternatively, the undiced matching layer 22 is also electrically conductive for forming a ground plane.

FIGS. 6 and 7 show yet another method for forming the electrodes 14, 16 with multiple layers 18 of transducer material. The signal electrodes 16 are patterned between every layer 18 of transducer material. The pattern provides for a diagonal structure isolating the electrode 16 within each element or sub-element. A plurality of diagonal dicing lines or kerfs 32 is formed. FIG. 6 is a top view showing the patterning of the electrodes 16 where the longitudinal direction is out of the plane of the FIG. 6. The electrodes 16 extend from the top to bottom of the resulting slab of the transducer material 20 and are within each of the elements 12 or sub-elements 21 defined by the kerfs 32. The kerfs 32 from the sub-elements 21 or elements 12 are at a non-perpendicular angle to the stacking dimension or horizontal dimension as shown in FIG. 6. The kerfs 32 avoid the patterned electrode 16, isolating the patterned electrode 16 within the elements. The direction of poling is either along the dimension of stacking or along the diagonal, such as associated with the kerfs 32. As shown in FIG. 7, the other electrodes 14 are formed on the outer surfaces of each element 12 or sub-elements 21. By metallizing or depositing electrodes 14 after dicing to form the kerfs 32, each of the elements 12 or sub-elements 21 has an electrode 14 around the entire outer surface, and a separate electrode 16 within the element 12 or sub-element 21. FIG. 7 shows a single element 12 with four sub-elements 21. Alternatively, the four sub-elements of FIG. 7 are used as individual (four) elements 12. Additional grinding, lapping or dicing may be used to remove electrodes on two opposing surfaces of each sub-element 21. Alternatively, the electrodes 14 are formed on all of the sides of each of the sub-elements 21. During operation, the resulting electronic field is diagonally oriented. The increased area of the electrodes 14 serves to increase the capacitance.

FIG. 8 shows an alternative embodiment. Rather than diagonal cuts, the kerfs 32 are formed with dicing substantially perpendicular to the stacking dimension. The electrodes 16 are patterned so that kerfs 32 avoid contact with the electrodes 16. As an alternative to patterning, a shallow kerf, via, grinding channel, or other structure provides a notch in each of the layers 18 for forming an electrode 16 with a greater volume. For example, a shallow kerf, such as 20 to 50 microns, is formed in each of the layers 18 for forming a 40 to 50 micron deep electrode 16. While shown as rectangular, circular, flat or other shapes for the central electrode 16 may be provided. The outer surface electrodes 14 are formed as discussed above for FIGS. 6 and 7. In one embodiment of the method shown in FIG. 8, each pair of layers 18 and associated central electrode 16 form a single element rather than sub-elements. For example, each layer 18 of transducer material is about 100 microns thick. Alternatively, sub-elements are formed as discussed above for FIG. 7.

An array of elements formed as discussed above is operated in $k_{31}$ resonant mode. The stacked layers 18 generate and receive acoustic energy along the longitudinal displacement direction 17 in response to a transverse electric field and poling. The elements 12 are used in a multi-dimensional array. In a two-dimensional array with small elements, such as a 250 micron pitch for operation at about 5 MHz, a four or higher pF capacitance for $k_{31}$ operation may be provided using a single layer structure. Electronics may be positioned adjacent to the elements for avoiding an impedance mismatch. For arrays intended for use in smaller spaces, such as in intracavity or cardiac catheters, electronics may be spaced from the array. Multiple layers in operation with the $k_{31}$ resonant mode may provide for better impedance matching. The operation in a $k_{31}$ resonant mode may provide roughly four times greater capacitance than the $k_{33}$ mode even with a same number of layers 18, when the height is at least two times of the element width.

The $k_{31}$ resonant mode provides a method for transducing between ultrasound and electrical energies. A plurality of ultrasound transducer elements 12 in a multi-dimensional array 10 are oriented to receive or transmit along a first direction 17. The height of each element 12 or sub-element 21 along the first direction 17 is at least twice, such as three times a width in a plane orthogonal to the first direction 17. Each of the transducer elements 12 is poled in a direction substantially perpendicular to the longitudinal displacement direction 17. Similarly, each of the transducer elements 12 is formed with at least two layers 18 of transducer materials. The layers 18 of transducer materials are stacked in a stacking direction substantially perpendicular to the longitudinal displacement direction 17. The ultrasound transducer elements 12 are then operated in a $k_{31}$ resonant mode. For transmission, electrical signals are applied on the electrodes of each of the transducer elements 12 on planes parallel to the longitudinal displacement direction 17. Due to the poling and/or greater height than width characteristics, the $k_{31}$ resonant mode is dominant over other modes within each of the elements 12 even where electrodes are additionally positioned on top and bottom surfaces of each element 12.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. An ultrasound transducer array for converting between acoustic and electrical energies, the array comprising:

a first transducer element operable in a $k_{31}$ resonance mode along a longitudinal displacement direction, the first transducer element having a top, a bottom and at least three sides relative to the longitudinal displacement direction; and a first electrode within the first transducer element and a second electrode on each of the at least three sides, the first and second electrodes being electrically isolated from each other.

2. The array of claim 1, wherein the first transducer element includes:

a first layer of transducer material; and a second layer of transducer material disposed substantially parallel to the first layer of transducer material;

wherein the first and second layers of transducer material are arranged substantially perpendicular to the top.

3. The array of claim 2 further comprising a third layer, wherein the third layer is disposed between first and second layers of transducer material.

4. The array of claim 3 further comprising a third electrode, wherein the third electrode is disposed between the first and second layers.

5. The array of claim 4, wherein the third electrode is electrically connected to one of the first and second electrodes.

6. The array of claim 1, wherein the top is an acoustic surface.

7. The array of claim 1, wherein the first electrode is carried between the first and second layers of transducer material, and wherein the second electrode is carried on an outer surface of the second layer.

8. The array of claim 1, wherein the at least three sides are disposed substantially perpendicular to the top, and wherein the at least three sides has a height that is at least twice the width of the first and second layers of transducer material.

9. The array of claim 1 further comprising:

a second transducer element; and a third transducer element;

wherein the first, second and third elements are arranged to define a multi-dimensional array.

10. The array of claim 1, wherein the first transducer element comprises four or more sub-elements and wherein each of the sub-elements includes first and second layers of transducer materials.

11. The array of claim 1 further comprising:

a matching layer generally parallel with and adjacent to the top.

12. The array of claim 1, wherein first transducer element poled in a direction substantially perpendicular to the longitudinal displacement direction.

* * * * *